United States Patent
Mogami

[11] Patent Number: 6,027,977
[45] Date of Patent: Feb. 22, 2000

[54] METHOD OF FABRICATING SEMICONDUCTOR DEVICE WITH MIS STRUCTURE

[75] Inventor: Toru Mogami, Tokyo, Japan

[73] Assignee: NEC Corporation, Tokyo, Japan

[21] Appl. No.: 09/078,811

[22] Filed: May 14, 1998

[30] Foreign Application Priority Data

May 14, 1997 [JP] Japan ................................ 9-123981

[51] Int. Cl.⁷ ........................ H01L 21/336; H01L 21/31
[52] U.S. Cl. ...................... 438/287; 438/291; 438/301; 438/303; 438/305; 438/769; 438/786
[58] Field of Search .................... 438/287, 291, 438/301, 303, 305, 769, 786

[56] References Cited

U.S. PATENT DOCUMENTS 5,258,333  11/1993  Shappir et al. ..................... 437/235

FOREIGN PATENT DOCUMENTS

| 0617461 | 3/1994 | European Pat. Off. . |
| 0 617 461 | 9/1994 | European Pat. Off. . |
| 59-55062 | 3/1984 | Japan . |
| 59-172729 | 9/1984 | Japan . |
| 64-35954 | 2/1989 | Japan . |
| 4-92423 | 3/1992 | Japan . |
| 4-157766 | 5/1992 | Japan . |
| 5-102482 | 4/1993 | Japan . |
| 5-82777 | 4/1993 | Japan . |
| 6-151829 | 5/1994 | Japan . |
| 6-267835 | 9/1994 | Japan . |
| 7-221092 | 8/1995 | Japan . |
| 8-23095 | 1/1996 | Japan . |
| 9-148543 | 6/1997 | Japan . |

OTHER PUBLICATIONS

Chuan Lin et al., "Leakage Current, Reliability Characteristics, and Boron Penetration of Ultra–Thin (32–36Å) $O_2$–Oxides and $N_2O$/NO Oxynitrides", IEDM 96, pp. 331–334, 1996 no month.

*Primary Examiner*—John F. Niebling
*Assistant Examiner*—Alexander G. Ghyka
*Attorney, Agent, or Firm*—Sughrue, Mion, Zinn, MacPeak & Seas, PLLC

[57] ABSTRACT

A fabrication method of a semiconductor device with the MIS structure is provided, which prevents the boron penetration phenomenon from occurring even if a gate insulator film is as thin as approximately 3 nm or less. After a silicon nitride film is formed on a semiconductor substrate, oxygen is doped into the silicon nitride film by a suitable process such as a thermal oxidation, ion implantation or plasma doping process, thereby forming an oxygen-doped silicon nitride film having an oxygen-rich region that extends along an interface between the oxygen-doped silicon nitride film and the substrate. The oxygen-rich region is higher in oxygen concentration than the remainder of the oxygen-doped silicon nitride film. At least part of the oxygen-doped silicon nitride film serves as a gate insulator film of a MISFET. Next, a gate electrode of the MISFET is formed on the oxygen-doped silicon nitride film. A dopant is selectively introduced into the substrate to form a pair of source/drain regions of the MISFET in the substrate at each side of the boron-doped gate electrode. Finally, the substrate is heat-treated to activate or anneal the dopant introduced into the substrate.

16 Claims, 6 Drawing Sheets

METHOD OF FABRICATING SEMICONDUCTOR DEVICE WITH MIS STRUCTURE

BACKGROUND OF THE INVENTION

1. Field of the Invention

The present invention relates to a method of fabricating a semiconductor device and more particularly, to a method of fabricating a so-called Metal-Insulator-Semiconductor Field-Effect Transistor (MISFET) on a semiconductor substrate.

2. Description of the Prior Art

Conventionally, a silicon dioxide ($SiO_2$) film was popularly used as a gate insulator of a MISFET, because a $SiO_2$ film has a good insulation property, a good reliability characteristic, and a low interface-trap density. In this case, a MISFET is, for example, fabricated in the following way.

First, as shown in FIG. 1A, an isolation region 102 is formed on a main surface of an n- or p-type single-crystal silicon (Si) substrate 101 by a selective oxidation process, i.e., LOCal Oxidation of Silicon (LOCOS) process. Then, a silicon dioxide ($SiO_2$) film 108 is formed on the exposed surface of the substrate 101 by a thermal oxidation process.

Subsequently, as shown in FIG. 1B, a gate electrode 105 is formed on the $SiO_2$ film 108. Then, a pair of sidewall spacers 106 are formed on the $SiO_2$ film 108 at each side of the gate electrode 105. The pair of sidewall spacers 106 are usually made of $SiO_2$.

Using the isolation region 102, the gate electrode 105, and the pair of sidewall spacers 106 as a mask, a p-type dopant such as boron (B) or an n-type dopant such as arsenic (As) is selectively ion-implanted into the surface area of the substrate 101 through the $SiO_2$ film 106 according to the conductivity type of the substrate 101. Thus, a pair of p- or n-type source/drain regions 107 are formed in the substrate 101 at each side of the gate electrode 105, as shown in FIG. 1C.

Since the p- or n-type dopant is implanted into the gate electrode 105 also during the above ion-implantation process, the ion-implanted gate electrode is denoted by a reference numeral 105a in FIG. 1C.

Finally, the substrate 101 is subjected to a heat treatment to activate or anneal the dopant atoms implanted into the substrate 101 during the step of forming the pair of source/drain regions 107.

Thus, a p- or n-channel MISFET is formed on the n- or p-type single-crystal silicon substrate 101 by the pair of source/drain regions 107, the $SiO_2$ film 108, and the gate electrode 105a. The part of the $SiO_2$ film 108 located just below the gate electrode 105a serves as a gate insulator of the MISFET.

In recent years, to further miniaturize a MISFET and to improve its performance, a gate insulator film has been required to be thinner. To cope with this requirement, p-type polycrystalline silicon (i.e., polysilicon) has been often used for forming a gate electrode in p-type MISFETs. P-type polysilicon has been usually fabricated by doping a p-type dopant, popularly boron (B), into undoped polysilicon.

When the gate electrode 105a is made of boron-doped polysilicon in the conventional method shown in FIGS. 1A to 1C, the following problem tends to occur.

Specifically, during the heat-treatment process for activating or annealing the dopant atoms implanted into the substrate 101, boron atoms doped into the gate electrode 105a tend to penetrate through the $SiO_2$ film 108 and then, the boron atoms that have penetrated through the $SiO_2$ film 108 are diffused into the part 101a of the substrate 101 just below the $SiO_2$ film 108 between the pair of source/drain regions 107. The part 101a of the substrate 101 is called the "channel region". The diffused boron atoms into the channel region 101a will fluctuate or deviate the threshold voltage of the MISFET.

The penetration of the boron atoms through the gate insulator film 108 has been termed the "boron penetration" phenomenon.

To prevent the "boron penetration" phenomenon from occurring, an improvement where a $SiO_2$ film doped with nitrogen (N) (i.e., nitrogen-doped $SiO_2$) is used as a gate insulator film was developed, which was reported in the paper, 1996 IEDM Technical Digest, page 331–334, written by C. Lin et al., and entitled "Leakage Current, Reliability Characteristics, and Boron Penetration of Ultra-Thin (32–36A) $O_2$-Oxides and $N_2O$/NO Oxynitrides".

However, this improvement has the following problems.

First, nitrogen-doped $SiO_2$ is used for forming a gate insulator film and therefore, the mobility of a carrier in the channel region 101a is lower than the case where undoped $SiO_2$ is used for forming a gate insulator film. Consequently, the performance of the MISFET degrades.

Second, to prevent the boron penetration phenomenon, the doping concentration of nitrogen of a nitrogen-doped $SiO_2$ film needs to be increased with the decreasing thickness of a gate insulator film. For example, if a gate insulator film is as thin as approximately 3 nm or less, the doping concentration of nitrogen of a nitrogen-doped $SiO_2$ film needs to be 10 atomic percents (at %) or higher. However, this is very difficult to be realized because of the following reason.

Specifically, a nitrogen-doped $SiO_2$ film is usually formed by heat-treating an undoped $SiO_2$ film in an atmosphere containing nitrogen oxide (i.e., NO or $N_2O$). Therefore, an undoped $SiO_2$ film is not only doped with nitrogen but also oxidized in this heat-treatment process. This oxidation unavoidably increases the thickness of a resultant nitrogen-doped $SiO_2$ film. As a result, it is not easy to increase the doping concentration of nitrogen of a nitrogen-doped $SiO_2$ film up to 10 at % or higher by the above heat-treatment process. This means that if a gate insulator film is as thin as approximately 3 nm or less, it is difficult to prevent the boron penetration phenomenon with the use of the nitrogen-doped $SiO_2$ film.

Moreover, technique where silicon nitride ($SiN_x$) isused for forming a gate insulator film instead of undoped $SiO_2$ has been known, which was disclosed, for example, in the Japanese Non-Examined Patent Publication No. 59-172729 published in 1984. This technique, however, has a problem that the subthreshold characteristics of a MISFET degrade, because the trap density at the interface between a silicon nitride film and a single-crystal silicon substrate is high.

SUMMARY OF THE INVENTION

Accordingly, an object of the present invention is to provide a method of fabricating a semiconductor device with the MIS structure that prevents the boron penetration phenomenon from occurring even if a gate insulator film is as thin as approximately 3 nm or less.

Another object of the present invention is to provide a method of fabricating a semiconductor device with the MIS structure that reduces fluctuation of the threshold voltage.

Still another object of the present invention is to provide a method of fabricating a semiconductor device with the MIS structure that is capable of decreasing the thickness of a gate insulator film to approximately 3 nm or less without any performance degradation of a MISFET such as the carrier mobility decrease and the subthreshold characteristic deterioration.

The above objects together with others not specifically mentioned will become clear to those skilled in the art from the following description.

A method of fabricating a semiconductor device according to the present invention is comprised of the following steps (a) to (e):

(a) A silicon nitride film is formed on a semiconductor substrate.

(b) Oxygen is doped into the silicon nitride film, thereby forming an oxygen-doped silicon nitride film having an oxygen-rich region that extends along an interface between the oxygen-doped silicon nitride film and the substrate.

The oxygen-rich region is higher in oxygen concentration than the remainder of the oxygen-doped silicon nitride film.

At least part of the oxygen-doped silicon nitride film serves as a gate insulator film of a MISFET.

(c) A gate electrode of the MISFET is formed on the oxygen-doped silicon nitride film.

(d) A dopant is selectively introduced into the substrate to form a pair of source/drain regions of the MISFET in the substrate at each side of the boron-doped gate electrode.

(e) The substrate is heat-treated to activate or anneal the dopant introduced into the substrate in the step (d).

With the method of fabricating a semiconductor device according to the present invention, the oxygen-doped silicon nitride film is used as the gate insulator film of the MISFET. Therefore, even if boron is doped into the gate electrode, the boron penetration phenomenon from the gate electrode toward the substrate is effectively prevented from occurring in a similar way to the case where undoped silicon nitride is used for the gate insulator film.

Thus, the threshold voltage fluctuation is reduced even if the gate insulator film is as thin as approximately 3 nm or less.

Moreover, the oxygen-doped silicon nitride film has the oxygen-rich region extending along the interface between the gate insulator film and the substrate, where the oxygen-rich region is higher in oxygen concentration than the remainder of the oxygen-doped silicon nitride film. Therefore, the mobility of a carrier in the channel region of the MISFET is approximately equal to the case where undoped silicon dioxide is used for the gate insulator film.

Also, due to the existence of the oxygen-rich region of the oxygen-doped silicon nitride film, the trap density at the interface between the gate insulator film and the substrate is approximately as low as the case of undoped silicon dioxide. Therefore, the subthreshold characteristics of the MISFET are approximately equal to the case of undoped silicon dioxide.

As a result, the thickness of the gate insulator film can be decreased to approximately 3 nm or less without any performance degradation of the MISFET.

In a preferred embodiment of the method according to the present invention, the step (b) of doping oxygen into the silicon nitride film is performed by thermal oxidation of the substrate with the silicon nitride film in an oxygen-containing atmosphere. In this case, there is an additional advantage that the step (b) can be simply performed.

The thermal oxidation is preferably performed at a temperature of 700 to 900° C. When the temperature is lower than 700° C., a satisfactorily high mobility of a carrier in the channel region is not realized. When the temperature is higher than 900° C., an obtainable oxidation rate is excessively high and therefore, the thickness controllability of the oxygen-doped silicon nitride film is unsatisfactorily low.

As the oxygen-containing atmosphere, an oxygen ($O_2$) gas or a mixture of oxygen and hydrogen ($H_2$) gases is preferably used. The oxygen content of the oxygen-containing atmosphere is preferably set as 20 to 100 volume %, as necessary.

In another preferred embodiment of the method according to the present invention, the step (b) of doping oxygen into the silicon nitride film is performed by ion-implanting oxygen into the silicon nitride film and by heat-treating the oxygen-implanted silicon nitride film. In this case, there is an additional advantage that the oxygen-rich region of the oxygen-doped silicon nitride film can be readily formed.

The ion implantation of oxygen into the silicon nitride film may be performed under any ion-implantation condition, as necessary.

The dose of oxygen ions is preferably set as $5 \times 10^{13}$ to $5 \times 10^{15}$ atoms/cm$^2$, and more preferably set as $5 \times 10^{14}$ to $5 \times 10^{15}$ atoms/cm$^2$. This is because the oxygen-doped silicon nitride film has a good quality for accomplishing the above objects if the dose of oxygen ions is set within these ranges.

The heat treatment of the oxygen-implanted silicon nitride film is preferably performed in an oxygen-containing or nitrogen-containing atmosphere. When this heat treatment is performed in an oxygen-containing atmosphere, there is an additional advantage that this heat-treatment can be simply performed and that oxygen is further doped into the oxygen-implanted silicon nitride film. When this heat treatment is performed in a nitrogen-containing atmosphere, there is an additional advantage that this heat-treatment can be simply performed while suppressing the thickness increase of the oxygen-implanted silicon nitride film during this heat-treatment process.

As the oxygen-containing atmosphere, an atmosphere containing an oxygen gas alone or a mixture of oxygen and hydrogen gasses is preferably used. As the nitrogen-containing atmosphere, an atmosphere containing a nitrogen gas alone is preferably used.

The heat-treatment of the oxygen-implanted silicon nitride film in the oxygen-containing atmosphere is preferably performed at a temperature of 700 to 1100° C. When the temperature is lower than 700° C., thermal stress generated in the silicon nitride film is difficult to be relaxed. When the temperature is higher than 1100° C., the quality of the silicon nitride film degrades due to thermal stress generated therein.

The period of the heat-treatment of the oxygen-implanted silicon nitride film is typically 60 minutes or less. However, this period may be suitably changed according to the heat-treatment temperature, the thickness of the silicon nitride film, or the like.

In still another preferred embodiment of the method according to the present invention, the step (b) of doping oxygen into the silicon nitride film is performed by plasma-doping oxygen into the silicon nitride film and by heat-treating the oxygen-implanted silicon nitride film. In this case, there is an additional advantage that the oxygen-rich region of the oxygen-doped silicon nitride film can be readily formed. It is known that plasma doping has an advantage of a higher doping rate than that of ion implantation.

The plasma doping of oxygen into the silicon nitride film may be performed under any plasma-doping condition, as necessary.

The heat treatment of the oxygen-doped silicon nitride film is preferably performed in an oxygen-containing or nitrogen-containing atmosphere. When this heat treatment is performed in an oxygen-containing atmosphere, there is an additional advantage that this heat-treatment can be simply performed and that oxygen is further doped into the oxygen-doped silicon nitride film. When this heat treatment is performed in a nitrogen-containing atmosphere, there is an additional advantage that this heat-treatment can be simply performed while suppressing the thickness increase of the oxygen-doped silicon nitride film during this heat-treatment process.

As the oxygen-containing atmosphere, an atmosphere containing an oxygen gas alone or a mixture of oxygen and hydrogen gasses is preferably used. As the nitrogen-containing atmosphere, an atmosphere containing a nitrogen gas alone is preferably used.

The heat-treatment of the oxygen-doped silicon nitride film in the oxygen-containing or nitrogen-containing atmosphere is preferably performed at a temperature of 700 to 1100° C. When the temperature is lower than 700° C., thermal stress generated in the silicon nitride film is difficult to be relaxed. When the temperature is higher than 1100° C., the quality of the silicon nitride film degrades due to thermal stress generated therein.

The period of the heat-treatment of the oxygen-implanted silicon nitride film is typically 60 minutes or less. However, this period may be suitably changed according to the heat-treatment temperature, the thickness of the silicon nitride film, or the like.

In the method according to the present invention, the silicon nitride film may be formed by any process in the step (a). However, it is preferred that the silicon nitride film in the step (a) is formed by thermally nitriding the substrate in an nitrogen-containing atmosphere such as $NH_3$, $NO$, or $NO_2$. This is because the silicon nitride film with a good quality is simply formed.

This thermal nitridation of the substrate is preferably performed at a temperature of 800 to 1000° C. When the temperature is lower than 800° C., the growth rate of the silicon nitride film is excessively low. When the temperature is higher than 1000° C., the thermal stress in the silicon nitride filmis excessively high.

The thickness of the silicon nitride film in the step (a) is preferably set as 1 to 5 nm, and is more preferably set as 1.5 to 3 nm. If it is less than 1 nm, the leakage current will be excessively large at the gate electrode due to the direct tunneling current and the silicon nitride film tends to have a lot of defects. If it is greater than 5 nm, the advantages of the present invention will not be effective.

If the thickness of the silicon nitride film in the step (a) is greater than 3 nm, the silicon nitride film tends to be excessively thick (e.g., greater than 5 nm thick) after the subsequent step (b) of dopingoxygeninto the silicon nitride film. If the thickness of the silicon nitride film in the step (a) is less than 1.5 nm, the disadvantages of the leakage current and defects tend to appear.

The thickness of the oxygen-doped silicon nitride film in the step (b) is preferably set as 1 to 5 nm, and is more preferably set as 1.5 to 4 nm. If it is less than 1 nm, the leakage current will be excessively large at the gate electrode due to the direct tunneling current and the silicon nitride film tends to have a lot of defects. If it is greater than 5 nm, the oxygen-doped silicon nitride film with a good quality may be difficult to be fabricated.

If the thickness of the oxygen-doped silicon nitride film in the step (b) is in the range of 1.5 to 4 nm, the oxygen-doped silicon nitride film will have a good quality without any defect.

BRIEF DESCRIPTION OF THE DRAWINGS

In order that the present invention may be readily carried into effect, it will now be described with reference to the accompanying drawings.

DETAILED DESCRIPTION OF THE PREFERRED EMBODIMENTS

Figure 1A:
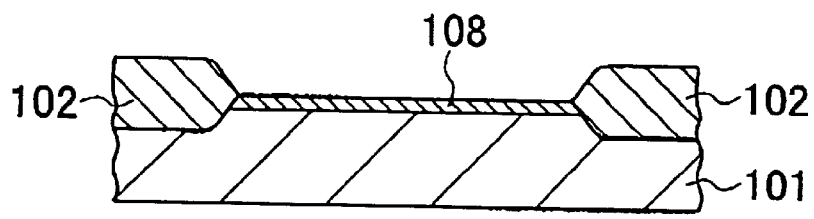
FIGS. 1A to 1C are partial, cross-sectional views showing a conventional method of fabricating a MISFET on a silicon substrate, respectively.
Figure 1B:
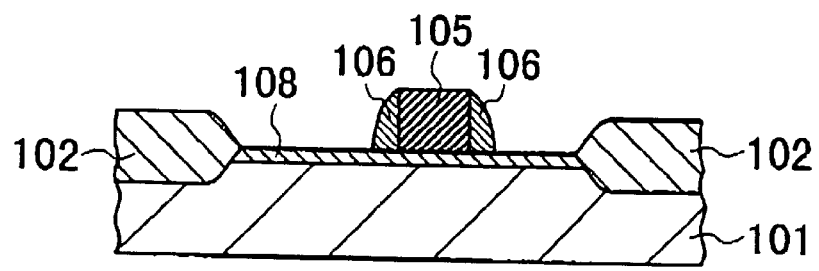
Figure 1C:
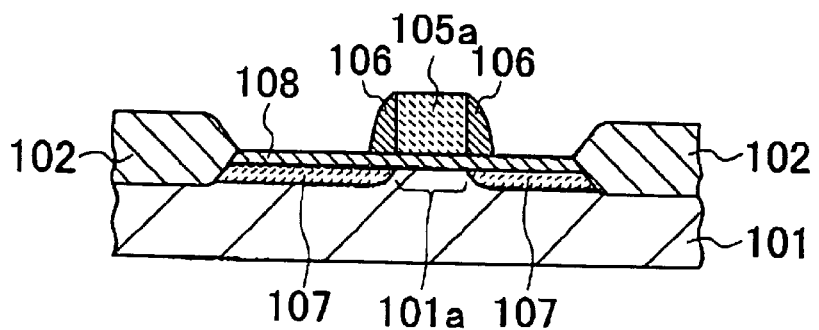

Preferred embodiments of the present invention will be described in detail below while referring to the drawings attached.

FIRST EMBODIMENT

Figure 2A:
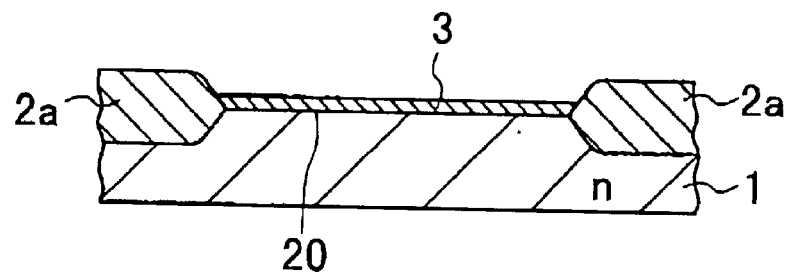
FIGS. 2A to 2C are partial, cross-sectional views showing a method of fabricating a MISFET on a silicon substrate according to a first embodiment of the present invention, respectively.
Figure 2B:
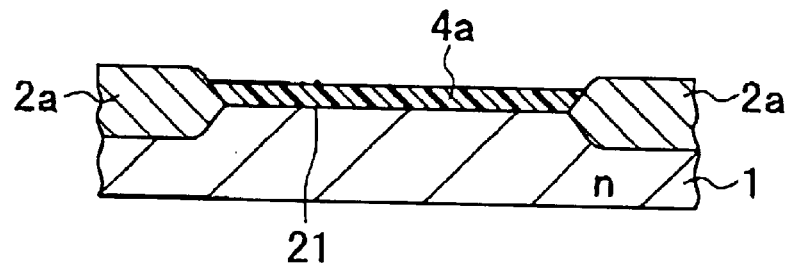
Figure 2C:
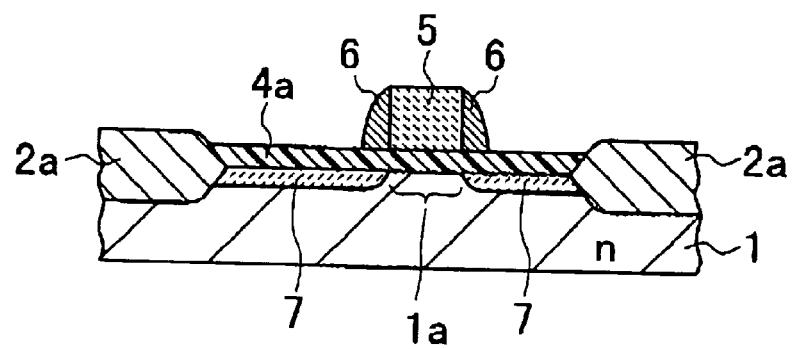

A method of fabricating a semiconductor device according to a first embodiment of the present invention is shown in FIGS. 2A to 2C.

First, as shown in FIG. 2A, an isolation region 2a is formed on a main surface of an n- type single-crystal silicon substrate 1 by a LOCOS process.

Next, a silicon nitride ($SiN_x$) film 3 with a thickness of 3 nm is formed on the exposed surface of the substrate 1 by a thermal nitridation process in an atmosphere containing an ammonia ($NH_3$) gas at a temperature of 900° C. The $SiN_x$ film 3 may be fabricated by a thermal nitridation process in an atmosphere containing a nitrogen oxide ($NO$ or $NO_2$) gas.

Subsequently, the silicon nitride ($SiN_x$) film 3 is thermally oxidized in an atmosphere containing the mixture of oxygen ($O_2$) and hydrogen ($H_2$) gasses at a temperature of 800° C. for 10 minutes, thereby forming an oxygen-doped silicon nitride film 4a with a thickness of 3.5 nm, as shown in FIG. 2B. The flow rate ratio of ($O_2/H_2$) is set as ½. The flow rate ratio of ($O_2/H_2$) may be set as 0.2 to 1 (i.e., 20 to 100 volume %) as necessary.

Since the atmosphere of the thermally oxidation process contains oxygen, the silicon nitride film 3 grows to become the thicker oxygen-doped silicon nitride film 4a after this process.

During this thermal oxidation process, not only the silicon nitride film 3 but also the surface area of the substrate 1 near the interface 20 between the silicon nitride film 3 and the substrate 1 are thermally oxidized. Through this thermal oxidation process, oxygen is doped into the whole silicon nitride film 3. However, the doped oxygen atoms are not uniformly distributed in the whole silicon nitride film 3. The doped oxygen atoms are mainly distributed in the vicinity of the interface 20 within the silicon nitride film 3, which is due to oxidation of silicon substrate 1. As a result, almost all the doped oxygen atoms are distributed in the lower part of the oxygen-doped silicon nitride film 4a near the interface 21 between the film 4a and the substrate 1.

Figure 5:
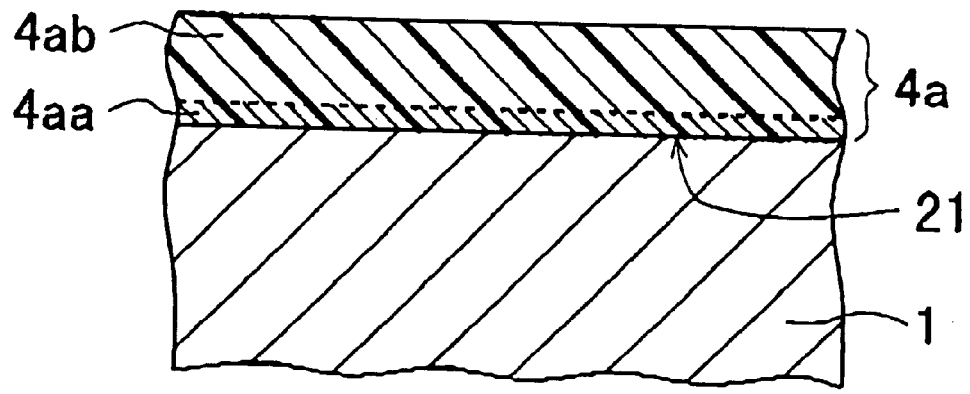
FIG. 5 is an enlarged, schematic, cross-sectional view showing the detailed structure of the oxygen-doped silicon nitride film in the methods of fabricating a MISFET according to the first, fourth, and fifth embodiments.

FIG. 5 schematically shows the detailed structure of the oxygen-doped silicon nitride film 4a formed in the method according to the first embodiment. As shown in FIG. 5, the lower part of the oxygen-doped silicon nitride film 4a forms an oxygen-rich region 4aa extending along the interface 21 between the silicon nitride film 4aa and the silicon substrate 1. The oxygen-rich region 4aa is higher in oxygen concentration than the remaining region (i.e., upper part) 4ab of the oxygen-doped silicon nitride film 4a.

Further, a polysilicon film (not shown) is deposited on the oxygen-doped silicon nitride film 4a and the isolation region 2a by a Chemical Vapor Deposition (CVD) process. The polysilicon film is then patterned by known processes, thereby forming a gate electrode 5 on the oxygen-doped silicon nitride film 4a, as shown in FIG. 2C.

A pair of sidewall spacers 6 are formed on the oxygen-doped silicon nitride film 4a at each side of the gate electrode 5 by CVD and etching-back processes. The pair of sidewall spacers 6 are made of $SiO_2$.

Using the isolation region 2a, the gate electrode 5, and the pair of sidewall spacers 6 as a mask, a boron fluoride ($BF_2$) as a p-type dopant is selectively ion-implanted into the surface area of the n-type substrate 1 through the oxygen-doped silicon nitride film 4a at an acceleration energy of 10 keV with a dose of $3 \times 10^{15}$ atoms/cm$^2$. Thus, a pair of p-type source/drain regions 7 are formed in the n-type substrate 1 at each side of the gate electrode 5, as shown in FIG. 2C.

The boron fluoride is ion-implanted into the gate electrode 5 also during this ion-implantation process.

Finally, the substrate 1 with the gate electrode assembly is subjected to a heat treatment at a temperature of 1000° C. to activate or anneal the $BF_2$ atoms implanted into the substrate 1 during the step of forming the pair of source/drain regions 7.

Thus, a p-channel MISFET is formed on the n-type single-crystal silicon substrate 1 by the pair of p-type source/drain regions 7, the oxygen-doped $SiN_x$ film 4a, and the boron-containing gate electrode 5. The part of the oxygen-doped $SiN_x$ film 4a located just below the gate electrode 5 serves as a gate insulator film of the MISFET. The gate length of this MISFET is 0.15 μm.

With the method of fabricating a semiconductor device according to the first embodiment, as described above, the oxygen-doped $SiN_x$ film 4a is used as the gate insulator film of the MISFET. Therefore, the boron penetration phenomenon from the boron-doped gate electrode 5 toward the substrate 1 is effectively prevented from occurring in a similar way to the case where undoped $SiN_x$ is used for the gate insulator film.

Thus, the threshold voltage fluctuation is reduced even if the gate insulator film 4a is as thin as approximately 3 nm or less.

Moreover, the oxygen-doped $SiN_x$ film 4a has the oxygen-rich region 4aa extending along the interface 21 between the $SiN_x$ film 4a and the substrate 1, where the oxygen-rich region 4aa is higher in oxygen concentration than the remaining upper region 4ab of the film 4a. Therefore, the mobility of a carrier in the channel region la of the p-channel MISFET is approximately equal to the case where undoped $SiO_2$ is used for the gate insulator film.

Also, due to the existence of the oxygen-rich region 4aa in the oxygen-doped $SiN_x$ film 4a, the trap density at the interface 21 between the gate insulator film 4a and the substrate 1 is approximately as low as the case of undoped $SiO_2$. Therefore, the subthreshold characteristics of the MISFET are approximately equal to the case of undoped $SiO_2$.

As a result, the thickness of the gate insulator film can be decreased to approximately 3 nm or less without any performance degradation of the MISFET.

SECOND EMBODIMENT

A method of fabricating a semiconductor device according to a second embodiment the present invention is shown in FIGS. 3A to 3D. In this embodiment, an ion-implantation process of oxygen is additionally provided before the thermal oxidation process for the $SiN_x$ film 3 in the first embodiment.

Figure 3A:
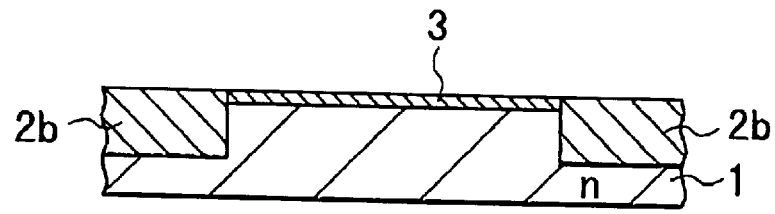
FIGS. 3A to 3D are partial, cross-sectional views showing a method of fabricating a MISFET on a silicon substrate according to a second embodiment of the present invention, respectively.

First, as shown in FIG. 3A, an isolation region 2b is formed on a main surface of an n- type single-crystal silicon substrate 1 by known processes. Unlike the first embodiment, the isolation region 2b has a trench isolation structure.

Then, a silicon nitride ($SiN_x$) film 3 with a thickness of 2.5 nm is formed on the exposed surface of the substrate 1 by a thermal nitridation process in an atmosphere containing an ammonia ($NH_3$) gas at a temperature of 800° C.

Figure 3B:
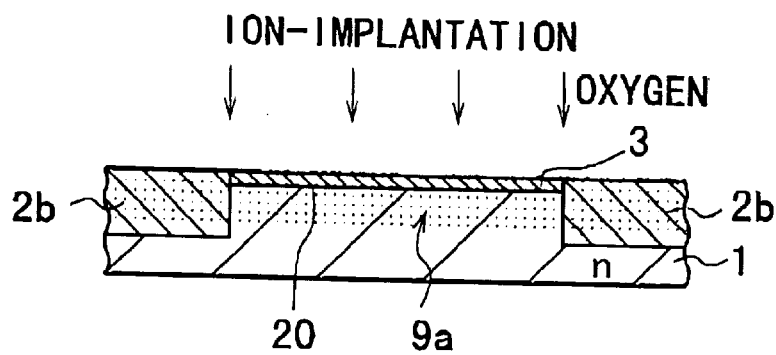

Subsequently, as shown in FIG. 3B, oxygen (O) is ion-implanted into the silicon nitride film 3 and the surface area of the substrate 1 at an acceleration energy of 20 keV with a dose of $1 \times 10^{15}$ atoms/cm$^2$. In this process, oxygen is ion-implanted into the isolation region 2b, also. The ion-implanted region of the substrate 1 is denoted by a reference numeral 9a in FIG. 3B.

To produce an oxygen-doped silicon nitride film 4b with a wanted quality, i.e., a sufficiently low density of interfacial traps and a sufficiently high mobility of a carrier, the dose of oxygen ions is preferably set as $5 \times 10^{13}$ to $5 \times 10^{15}$ atoms/cm$^2$, and more preferably set as $5 \times 10^{14}$ to $5 \times 10^{15}$ atoms/cm$^2$.

Figure 3C:
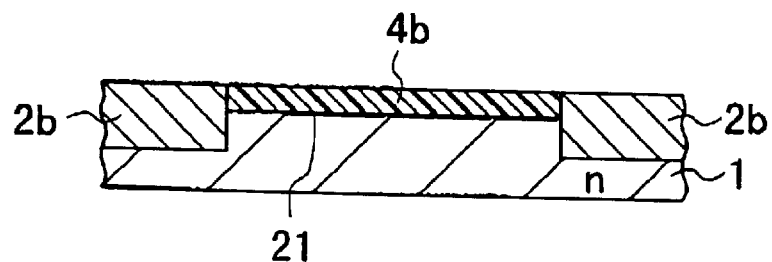

Following this ion-implantation process, the silicon nitride ($SiN_x$) film 3 is thermally oxidized in an atmosphere containing an oxygen ($O_2$) gas alone at a temperature of 900° C., thereby forming an oxygen-doped silicon nitride film 4b with a thickness of 3 nm, as shown in FIG. 3C.

Since the atmosphere of the thermally oxidation process contains oxygen, the silicon nitride film 3 grows to become the thicker oxygen-doped silicon nitride film 4b after this process.

During this thermal oxidation process, not only the silicon nitride film 3 but also the surface area of the substrate 1 near the interface 20 between the silicon nitride film 3 and the substrate 1 are thermally oxidized. Through this thermal oxidation process, oxygen atoms are newly introduced from the environment into the whole silicon nitride film 3 and at the same time, the formerly-implanted oxygen atoms are redistributed. However, the introduced oxygen atoms are not uniformly distributed in the whole silicon nitride film 3. The introduced oxygen atoms are mainly distributed in the vicinity of the interface 20 within the silicon nitride film 3, which is due to oxidation of silicon substrate 1. As a result, almost all the doped oxygen atoms are distributed in the lower part of the oxygen-doped silicon nitride film 4b near the interface between the film 4b and the substrate 1.

Figure 6:
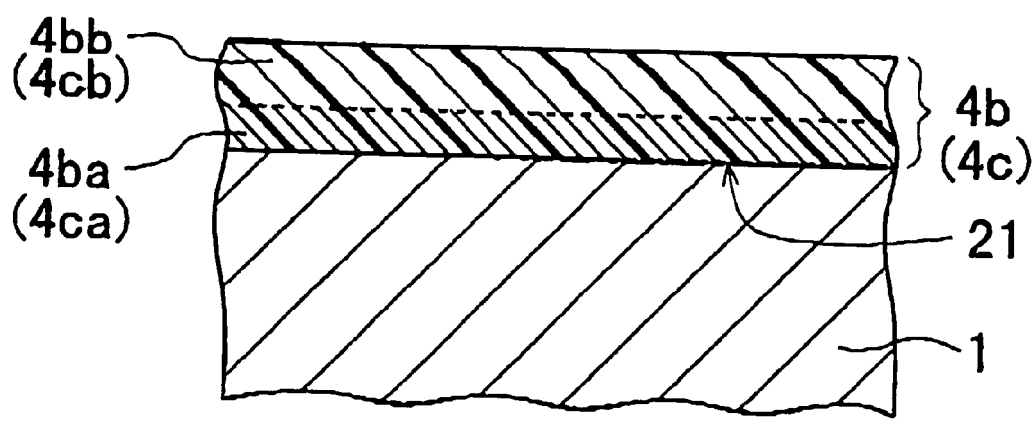
FIG. 6 is an enlarged, schematic, cross-sectional view showing the detailed structure of the oxygen-doped silicon nitride film in the methods of fabricating a MISFET according to the second and third embodiments.

FIG. 6 schematically shows the detailed structure of the oxygen-doped silicon nitride film 4b formed in the method according to the second embodiment. As shown in FIG. 6, the lower part of the oxygen-doped silicon nitride film 4b forms an oxygen-rich region 4ba extending along the interface 21 between the silicon nitride film 4b and the silicon substrate 1. The oxygen-rich region 4ba is higher in oxygen concentration than the remaining region (i.e., upper part) 4bb of the oxygen-doped silicon nitride film 4b.

Since ionized oxygen atoms are introduced by the ion-implantation process prior to the thermal oxidation process in the second embodiment, the amount of the oxygen atoms thermally introduced into the $SiN_x$ film 3 form the substrate 1 is greater than that of the first embodiment. Accordingly, the thickness and the oxygen concentration of the oxygen rich region 4bb of the oxygen-doped silicon nitride film 4b is greater than those of the oxygen rich region 4ab of the oxygen-doped silicon nitride film 4a.

Further, in the same way as that of the first embodiment, a gate electrode 5 is formed on the oxygen-doped silicon nitride film 4b by depositing and patterning a polysilicon film and then, a pair of sidewall spacers 6 are formed on the oxygen-doped silicon nitride film 4b at each side of the gate electrode 5.

Figure 3D:
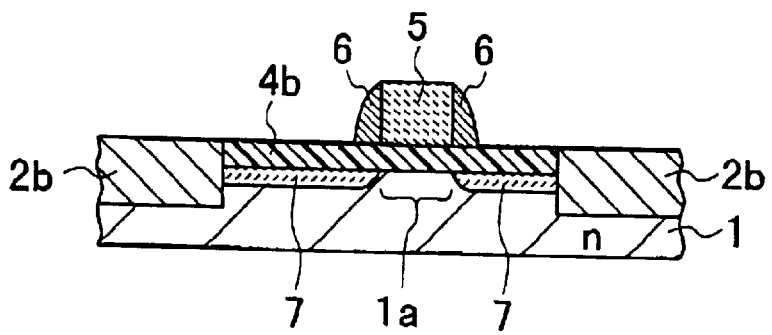

Using the isolation region 2b, the gate electrode 5, and the pair of sidewall spacers 6 as a mask, boron (B) as a p-type dopant is selectively ion-implanted into the surface area of the substrate 1 through the oxygen-doped silicon nitride film 4b at an acceleration energy of 5 keV with a dose of $3\times10^{15}$ atoms/cm$^2$. Thus, a pair of p-type source/drain regions 7 are formed in the n-type silicon substrate 1 at each side of the gate electrode 5, as shown in FIG. 3D. Boron is ion-implanted into the gate electrode 5 also during this ion-implantation process.

Finally, the substrate 1 is subjected to a heat treatment at a temperature of 1050° C. to activate or anneal the boron atoms implanted into the substrate 1 during the step of forming the pair aof source/drain regions 7.

Thus, a p-channel MISFET is formed on the n-type single-crystal silicon substrate 1 by the pair of p-type source/drain regions 7, the oxygen-doped $SiN_x$ film 4b, and the gate electrode 5. The part of the oxygen-doped $SiN_x$ film 4b located just below the gate electrode 5 serves as a gate insulator of the MISFET. The gate length of this MISFET is 0.1 μm.

With the method of fabricating a semiconductor device according to the second embodiment, like the first embodiment, the oxygen-doped $SiN_x$ film 4b is used as the gate insulator film of the MISFET. Therefore, there are the same advantages as those in the first embodiment.

In the second embodiment, unlike the first embodiment, the ion-implantation process for introducing oxygen atoms into the $SiN_x$ film 3 is additionally performed prior to the thermal oxidation process of the $SiN_x$ film 3. Therefore, as shown in FIG. 6, the oxygen-doped $SiN_x$ film 4b has an oxygen-rich region 4ba with a greater thickness and oxygen concentration than those in the first embodiment. As a result, the obtainable performance of the MISFET is better than the first embodiment.

THIRD EMBODIMENT

A method of fabricating a semiconductor device according to a third embodiment is shown in FIGS. 4A to 4D. In this embodiment, a plasma-doping process is used instead of an ion-implantation process used in the second embodiment.

Figure 4A:
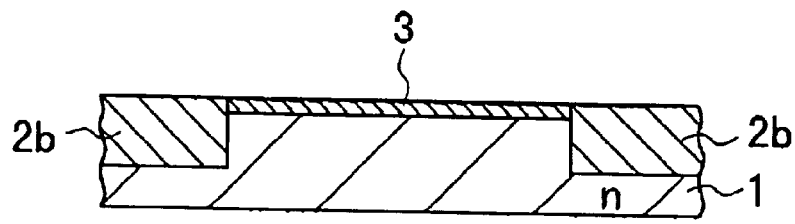
FIGS. 4A to 4D are partial, cross-sectional views showing a method of fabricating a MISFET on a silicon substrate according to a third embodiment of the present invention, respectively.

First, as shown in FIG. 4A, an isolation region 2b is formed on a main surface of an n-type single-crystal silicon substrate 1 by known processes. Like the second embodiment, the isolation region 2b has a trench isolation structure.

Then, a silicon nitride ($SiN_x$) film 3 with a thickness of 3 nm is formed on the exposed surface of the substrate 1 by a thermal nitridation process in an atmosphere containing an ammonia ($NH_3$)gas at a temperature of 900° C.

Figure 4B:
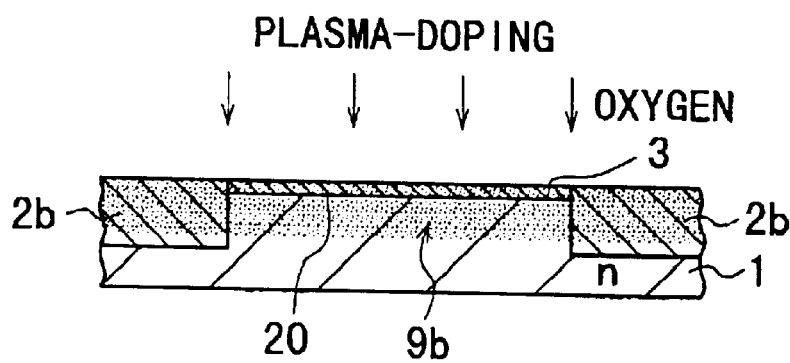

Subsequently, as shown in FIG. 4B, oxygen (O) is introducedor doped in to the silicon nitride film 3 and the surface area of the substrate 1 by a plasma doping process while a bias voltage of −1 keV is applied to the substrate 1 using an oxygen gas. In this process, oxygen atoms are introduced into the isolation region 2b, also. The oxygen-doped region of the substrate 1 is denoted by a reference numeral 9b in FIG. 4B.

In the plasma-doping process, oxygen atoms are ionized in a vacuum cavity and then, the ionized oxygen atoms are accelerated by an electric field to be introduced into the silicon nitride film 3 and the substrate 1.

Figure 4C:
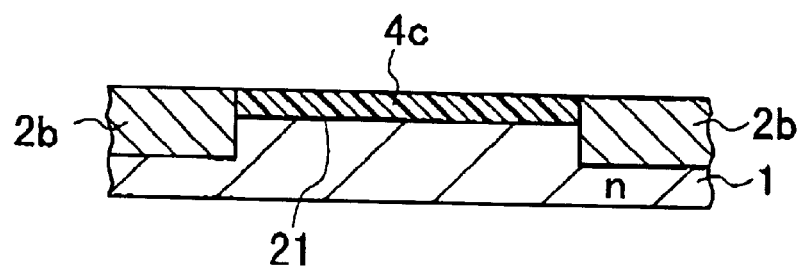

Following this plasma-doping process, the silicon nitride ($SiN_x$) film 3 is thermally oxidized in an atmosphere containing an oxygen ($O_2$) gas alone at a temperature of 800° C., thereby forming an oxygen-doped silicon nitride film 4c with a thickness of 3.2 nm, as shown in FIG. 4C.

Further, in the same way as that of the first embodiment, a gate electrode 5 is formed on the oxygen-doped silicon nitride film 4c by depositing and patterning a polysilicon film and then, a pair of sidewall spacers 6 are formed on the oxygen-doped silicon nitride film 4c at each side of the gate electrode 5.

Figure 4D:
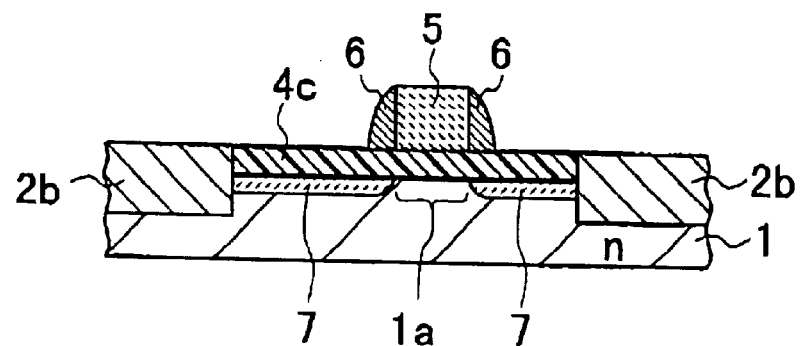

Using the isolation region 2b, the gate electrode 5, and the pair of sidewall spacers 6 as a mask, boron fluoride ($BF_2$) as a p-type dopant is selectively ion-implanted into the surface area of the substrate 1 through the oxygen-doped silicon nitride film 4c at an acceleration energy of 10 keV with a dose of $3\times10^{15}$ atoms/cm$^2$. Thus, a pair of p-type source/drain regions 7 are formed in the n-type substrate 1 at each side of the gate electrode 5, as shown in FIG. 4D. Boron atoms are introduced into the gate electrode 5 also during this ion-implantation process.

Finally, the substrate 1 is subjected to a heat treatment at a temperature of 950° C. to activate or anneal the boron atoms implanted into the substrate 1 during the step of forming the pair of source/drain regions 7.

Thus, a p-channel MISFET is formed on the n-type single-crystal silicon substrate 1 by the pair of p-type source/drain regions 7, the oxygen-doped $SiN_x$ film 4c, and the gate electrode 5. The part of the oxygen-doped $SiN_x$ film 4c located just below the gate electrode 5 serves as a gate insulator of the MISFET. The gate length of this MISFET is 0.13 μm.

With the method of fabricating a semiconductor device according to the third embodiment, like the first embodiment, the oxygen-doped $SiN_x$ film 4c is used as the gate insulator film of the MISFET. Therefore, there are the same advantages as those in the first embodiment.

In the third embodiment, to form the oxygen-doped $SiN_x$ film 4c, the plasma-doping process for introducing oxygen into the $SiN_x$ film 3 is additionally performed prior to the thermal oxidation process of the $SiN_x$ film 3. The introduced oxygen atoms into the $SiN_x$ film 3 are uniformly distributed in the whole film 3, and the introduced oxygen atoms into the substrate 1 are collected to the vicinity of the interface 20 between the $SiN_x$ film 3 and the substrate 1 during the thermal oxidation process. As a result, the $SiN_x$ film 3 grows by the thermal oxidation to become the $SiN_x$ film 4c thicker than the film 3.

Thus, as shown in FIG. 6, the oxygen-doped $SiN_x$ film 4c has substantially a same oxygen-rich region 4ca as the oxygen-rich region 4ba of the oxygen-doped $SiN_x$ film 4b in the second embodiment. This means that the obtainable performance of the MISFET is substantially the same as the second embodiment.

FOURTH EMBODIMENT

A method of fabricating a semiconductor device according to a fourth embodiment is substantially the same as that of the second embodiment, except that the conductivity type of the MISFET is opposite, i.e., the n-type. Therefore, the process steps will be explained below with reference to FIGS. 3A to 3D.

First, as shown in FIG. 3A, an isolation region 2b with a trench isolation structure is formed on a main surface of a p-type single-crystal silicon substrate 1 by known processes.

Then, a silicon nitride ($SiN_x$) film 3 with a thickness of 2 nm is formed on the exposed surface of the substrate 1 by a thermal nitridation process in an atmosphere containing an ammonia ($NH_3$) gas at a temperature of 850° C.

Subsequently, as shown in FIG. 3B, oxygen (O) is ion-implanted into the silicon nitride film 3 and the surface area of the substrate 1 at an acceleration energy of 15 keV with a dose of $5 \times 10^{14}$ atoms/cm². In this process, oxygen is ion-implanted into the isolation region 2b, also. The ion-implanted region of the substrate 1 is denoted by a reference numeral 9a in FIG. 3B.

Following this ion-implantation process, the silicon nitride ($SiN_x$) film 3 is thermally annealed in an atmosphere containing a nitrogen ($N_2$) gas alone at a temperature of 1000° C., thereby forming an oxygen-doped silicon nitride film 4b with a thickness of 2.8 nm, as shown in FIG. 3C. Since this process is conducted in the $N_2$ atmosphere for annealing the film 3, the oxygen-doped silicon nitride film 4b has a structure shown in FIG. 5 (not in FIG. 6).

Further, in the same way as that of the second embodiment, a gate electrode 5 is formed on the oxygen-doped silicon nitride film 4b by depositing and patterning a polysilicon film and then, a pair of sidewall spacers 6 are formed on the oxygen-doped silicon nitride film 4b at each side of the gate electrode 5.

Using the isolation region 2b, the gate electrode 5, and the pair of sidewall spacers 6 as a mask, arsenic (As) as an n-type dopant is selectively ion-implanted into the surface area of the substrate 1 through the oxygen-doped silicon nitride film 4b at an acceleration energy of 20 keV with a dose of $2 \times 10^{15}$ atoms/cm². Thus, a pair of n-type source/drain regions 7 are formed in the p-type substrate 1 at each side of the gate electrode 5, as shown in FIG. 3D. Arsenic is ion-implanted into the gate electrode 5 also during this ion-implantation process.

Finally, the substrate 1 is subjected to a heat treatment at a temperature of 1050° C. to activate or anneal the As atoms implanted into the substrate 1 during the step of forming the pair of source/drain regions 7.

Thus, an n-channel MISFET is formed on the p-type single-crystal silicon substrate 1 by the pair of n-type source/drain regions 7, the oxygen-doped $SiN_x$ film 4b, and the gate electrode 5. The part of the oxygen-doped $SiN_x$ film 4b located just below the gate electrode 5 serves as a gate insulator of the MISFET. The gate length of this MISFET is 0.1 μm.

With the method of fabricating a semiconductor device according to the fourth embodiment, it is clear that there are the same advantages as those in the second embodiment, except for the advantage of preventing the boron penetration phenomenon. Because the gate electrode 5 is not doped with boron in the n-channel MISFET fabricated by the method according to the fourth embodiment, the boron penetration phenomenon will not occur.

FIFTH EMBODIMENT

A method of fabricating a semiconductor device according to a fifth embodiment is substantially the same as that of the third embodiment. Therefore, the process steps will be explained below with reference to FIGS. 4A to 4D.

First, as shown in FIG. 4A, an isolation region 2b with a trench isolation structure is formed on a main surface of a p-type single-crystal silicon substrate 1 by known processes.

Then, a silicon nitride ($SiN_x$) film 3 with a thickness of 1.5 nm is formed on the exposed surface of the substrate 1 by a thermal nitridation process in an atmosphere containing an ammonia ($NH_3$) gas at a temperature of 800° C.

Subsequently, as shown in FIG. 4B, oxygen (O) is introduced or doped into the silicon nitride film 3 and the surface area of the substrate 1 by a plasma doping process while a bias voltage of −−0.5 keV is applied to the substrate 1 using an oxygen gas. In this process, oxygen atoms are introduced into the isolation region 2b, also. The oxygen-doped region of the substrate 1 is denoted by a reference numeral 9b in FIG. 4B.

In the plasma-doping process, oxygen atoms are ionized in a vacuum cavity and then, the ionized oxygen atoms are accelerated by an electric field to be introduced into the silicon nitride film 3 and the substrate 1.

Following this plasma-doping process, the silicon nitride ($SiN_x$) film 3 is thermally annealed in an atmosphere containing a nitrogen ($N_2$) gas alone at a temperature of 950° C., thereby forming an oxygen-doped silicon nitride film 4c with a thickness of 2 nm, as shown in FIG. 4C. Since this process is conducted in the $N_2$ atmosphere for annealing the film 3, the oxygen-doped silicon nitride film 4b has a structure shown in FIG. 5 (not in FIG. 6).

Further, in the same way as that of the first embodiment, a gate electrode 5 is formed on the oxygen-doped silicon nitride film 4c by depositing and patterning a polysilicon film and then, a pair of sidewall spacers 6 are formed on the oxygen-doped silicon nitride film 4c at each side of the gate electrode 5.

Using the isolation region 2b, the gate electrode 5, and the pair of sidewall spacers 6 as a mask, arsenic (As) as an n-type dopant is selectively ion-implanted into the surface area of the substrate 1 through the oxygen-doped silicon nitride film 4c at an acceleration energy of 15 keV with a dose of $2 \times 10^{15}$ atoms/cm². Thus, a pair of n-type source/drain regions 7 are formed in the p-type substrate 1 at each side of the gate electrode 5, as shown in FIG. 4D. Arsenic atoms are introduced into the gate electrode 5 also during this ion-implantation process.

Finally, the substrate 1 is subjected to a heat treatment at a temperature of 1000° C. to activate the arsenic atoms implanted into the substrate 1 during the step of forming the pair of source/drain regions 7.

Thus, an n-channel MISFET is formed on the p-type single-crystal silicon substrate 1 by the pair of n-type source/drain regions 7, the oxygen-doped $SiN_x$ film 4c, and the gate electrode 5. The part of the oxygen-doped $SiN_x$ film 4c located just below the gate electrode 5 serves as a gate insulator of the MISFET. The gate length of this MISFET is 0.1 μm.

With the method of fabricating a semiconductor device according to the fifth embodiment, it is clear that there are the same advantages as those in the second embodiment, except for the advantage of preventing the boron penetration phenomenon. Because the gate electrode 5 is not doped with boron in the n-channel MISFET fabricated by the method according to the fifth embodiment, the boron penetration phenomenon will not occur.

TESTS

The inventor conducted the confirmation tests for confirming the advantage of the method according to the present invention. The result of the tests is shown in FIGS. 7 and 8.

Figure 7:
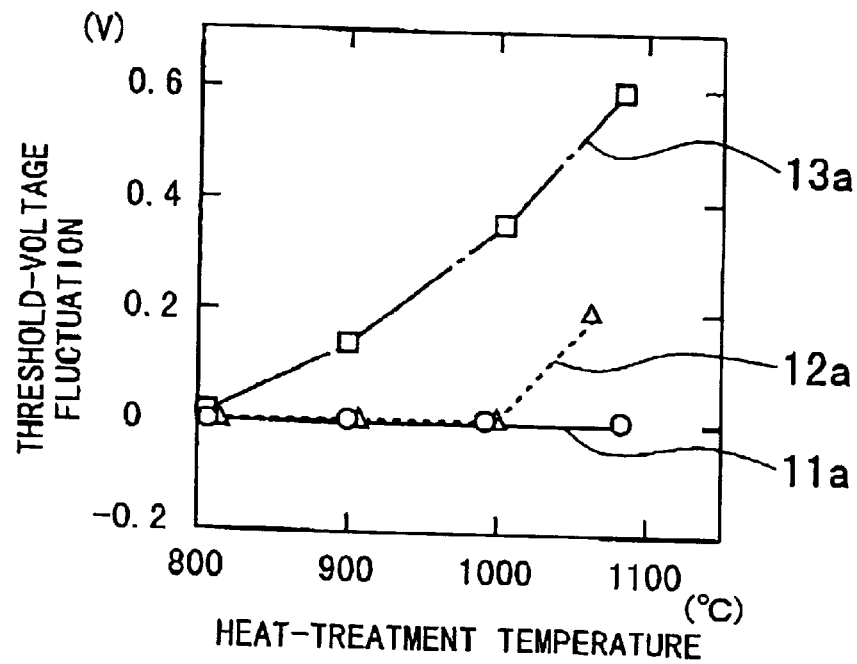
FIG. 7 is a graph showing the relationship between the heat-treatment temperature and the threshold-voltage fluctuation.
Figure 8:
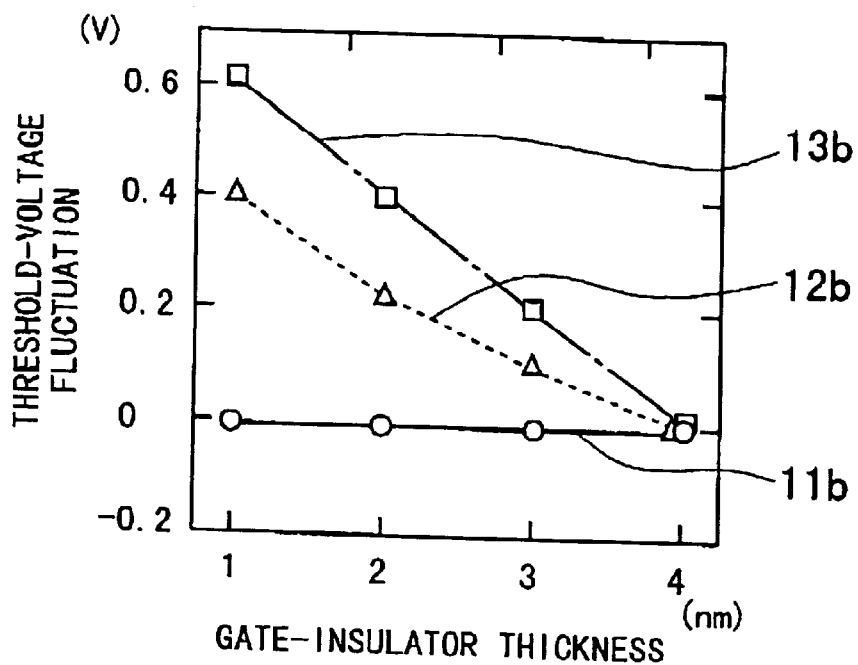
FIG. 8 is a graph showing the relationship between the gate-insulator thickness and the threshold-voltage fluctuation.

FIG. 7 shows the relationship between the temperature of the heat-treatment for activating or annealing the dopants implanted into the pair of source/drain regions 7 and the threshold voltage fluctuation of the MISFET.

In FIG. 7, the curve 11a indicates the relationship of a MISFET fabricated by the method according to the second embodiment, the curve 12a indicates that of a MISFET fabricated by the conventional method using a nitrided $SiO_2$ film, and the curve 13a indicates that of a MISFET fabricated by the conventional method using an undoped $SiO_2$ film.

It is clearly seen from FIG. 7 that the MISFET according to the second embodiment has substantially no fluctuation of the threshold voltage independent of the heat-treatment temperature, which is unlike the MISFETs according to the two conventional MISFETs. This means that the boron penetration phenomenon is effectively prevented from occurring in the MISFET fabricated according to the first embodiment.

FIG. 6 shows the relationship between the gate insulator thickness and the threshold voltage fluctuation.

In FIG. 8, the curve 11b indicates the relationship of a MISFET fabricated by the method according to the second embodiment, the curve 12b indicates that of a MISFET fabricated by the conventional method using a nitrided $SiO_2$ film, and the curve 13b indicates that of a MISFET fabricated by the conventional method using an undoped $SiO_2$ film.

It is clearly seen from FIG. 8 that the MISFET according to the second embodiment has substantially no fluctuation of the threshold voltage independent of the gate insulator thickness, which is unlike the MISFETs according to the two conventional MISFETs. This means that the boron penetration phenomenon is effectively prevented from occurring in the MISFET fabricated according to the first embodiment even if the gate insulator is as thin as approximately 3 nm or less.

In the above-described first to fifth embodiments, the silicon nitride film 3 and the oxygen-doped silicon nitride film 4a, 4b, or 4c are formed to cover the whole exposed main surface of the substrate 1. However, it is needless to say that they may be formed to cover only a part of the exposed main surface of the substrate 1 on which the gate electrode 5 is formed, thereby uncovering the remainder of the main surface of the substrate 1 at the locations over the pair of source/drain regions 7.

While the preferred forms of the present invention has been described, it is to be understood that modifications will be apparent to those skilled in the art without departing from the spirit of the invention. The scope of the invention, therefore, is to be determined solely by the following claims.

What is claimed is:

1. A method of fabricating a semiconductor device, comprising the steps of:
   (a) forming a silicon nitride film on a semiconductor substrate;
   (b) ion-implanting oxygen into said silicon nitride film and by heat-treating said oxygen-implanted silicon nitride film, thereby forming an oxygen-doped silicon nitride film having an oxygen-rich region that extends along an interface between said oxygen-doped silicon nitride film and said substrate;
   said oxygen-rich region being higher in oxygen concentration than a remainder of said oxygen-doped silicon nitride film;
   at least part of said oxygen-doped silicon nitride film serving as a gate insulator film of a MISFET;
   (c) forming a gate electrode of said MISFET on said oxygen-doped silicon nitride film;
   (d) selectively introducing a dopant into said substrate to form a pair of source/drain regions of said MISFET in said substrate at each side of said gate electrode; and
   (e) heat-treating said substrate to activate said dopant introduced into said substrate in said step (d).

2. A method as claimed in claim 1, wherein said heat treatment of said oxygen-implanted silicon nitride film is performed in an oxygen-containing atmosphere.

3. A method as claimed in claim 2, wherein said heat treatment of said oxygen-implanted silicon nitride film is performed at a temperature of 700 to 1100° C.

4. A method as claimed in claim 1, wherein said heat treatment of said oxygen-implanted silicon nitride film is performed in a nitrogen-containing atmosphere.

5. A method as claimed in claim 4, wherein said heat treatment of said oxygen-implanted silicon nitride film is performed at a temperature of 700 to 1100° C.

6. A method as claimed in claim 1, wherein said silicon nitride film is formed by thermally nitriding said substrate in an atmosphere containing one selected from the group consisting of $NH_3$, NO, and $NO_2$.

7. A method as claimed in claim 1, wherein said silicon nitride film in the step (a) has a thickness of 1 to 5 nm.

8. A method as claimed in claim 1, wherein said oxygen-doped silicon nitride film in the step (b) has a thickness of 1 to 5 nm.

9. The method as claimed in claim 1, wherein said oxygen-doped silicon nitride film in the step (b) is implanted using an acceleration voltage of about 20 keV.

10. A method of fabricating a semiconductor device, comprising the steps of:
    (a) forming a silicon nitride film on a semiconductor substrate;
    (b) plasma-doping oxygen into said silicon nitride film and heat-treating said oxygen-implanted silicon nitride film, thereby forming an oxygen-doped silicon nitride film having an oxygen-rich region that extends along an interface between said oxygen-doped silicon nitride film and said substrate;
    said oxygen-rich region being higher in oxygen concentration than a remainder of said oxygen-doped silicon nitride film;
    wherein at least part of said oxygen-doped silicon nitride film serves as a gate insulator film of a MISFET;

(c) forming a gate electrode of said MISFET on said oxygen-doped silicon nitride film;

(d) selectively introducing a dopant into said substrate to form a pair of source/drain regions of said MISFET in said substrate at each side of said gate electrode; and (e) heat-treating said substrate to activate said dopant introduced into said substrate in said step (d).

11. The method as claimed in claim 10, wherein said heat treatment of said oxygen-implanted silicon nitride film is performed in an atmosphere containing one selected from the group consisting of an oxygen gas and a mixture of oxygen and hydrogen gases.

12. The method as claimed in claim 11, wherein said heat treatment of said oxygen-implanted silicon nitride film is performed at a temperature of 700 to 1100° C.

13. The method as claimed in claim 10, wherein said silicon nitride film is formed by thermally nitriding said substrate in an atmosphere containing one selected from the group consisting of $NH_3$, NO, and $NO_2$.

14. The method as claimed in claim 10, wherein said silicon nitride film in the step (a) has a thickness of 1 to 5 nm.

15. The method as claimed in claim 10, wherein said oxygen-doped silicon nitride film in the step (b) has a thickness of 1 to 5 nm.

16. The method as claimed in claim 10, wherein said oxygen-doped silicon nitride film in the step (b) is plasma-doped using a bias voltage of about −1.0 keV.

* * * * *

UNITED STATES PATENT AND TRADEMARK OFFICE
CERTIFICATE OF CORRECTION

PATENT NO.   : 6,027,977
DATED        : February 22, 2000
INVENTOR(S)  : Toru Mogami It is certified that error appears in the above-identified patent and that said Letters Patent is hereby corrected as shown below:

Column 1,
Line 25, delete "106" and insert therefor --108--.

Column 14,
Line 40, delete "1" and insert therefor --4--,
Line 44, delete "1" and insert therefor --4--,
Line 47, delete "1" and insert therefor --4--,
Line 50, delete "1" and insert therefor --4--.

Signed and Sealed this

Thirty-first Day of July, 2001

*Attest:*

NICHOLAS P. GODICI
*Attesting Officer*  Acting Director of the United States Patent and Trademark Office